United States Patent
Nobe et al.

(10) Patent No.: US 6,930,870 B2
(45) Date of Patent: Aug. 16, 2005

(54) SEMICONDUCTOR DEVICE WITH PROTECTIVE FUNCTIONS

(75) Inventors: Takeshi Nobe, Hirakata (JP); Shigeo Akiyama, Neyagawa (JP); Noriteru Furumoto, Hirakata (JP); Takuya Sunada, Osaka (JP)

(73) Assignee: Matsushita Electric Works, Ltd., Osaka (JP)

( * ) Notice: Subject to any disclaimer, the term of this patent is extended or adjusted under 35 U.S.C. 154(b) by 323 days.

(21) Appl. No.: 10/380,171

(22) PCT Filed: Sep. 27, 2001

(86) PCT No.: PCT/JP01/08419

§ 371 (c)(1),
(2), (4) Date: Mar. 18, 2003

(87) PCT Pub. No.: WO02/29949

PCT Pub. Date: Apr. 11, 2002

(65) Prior Publication Data

US 2004/0051145 A1 Mar. 18, 2004

(30) Foreign Application Priority Data

Sep. 29, 2000 (JP) .................................... 2000-300894

(51) Int. Cl.[7] .................................................. H02H 5/00
(52) U.S. Cl. .......................... 361/103; 361/58; 361/106
(58) Field of Search ................................ 361/103, 104, 361/106, 58, 100, 93.1

(56) References Cited

U.S. PATENT DOCUMENTS

| | | | |
|---|---|---|---|
| 4,893,158 A | | 1/1990 | Mihara et al. ............ 357/23.13 |
| 5,285,095 A | * | 2/1994 | Toyoda ........................ 257/360 |
| 5,303,110 A | | 4/1994 | Kumagai ..................... 361/18 |
| 5,408,102 A | | 4/1995 | Okumura ..................... 250/551 |

FOREIGN PATENT DOCUMENTS

EP  1028467  8/2000  ........... H01L/27/02

* cited by examiner

*Primary Examiner*—Stephen W. Jackson
(74) *Attorney, Agent, or Firm*—Greenblum & Bernstein, P.L.C.

(57) ABSTRACT

The semiconductor device is inserted between a power source and a load. A current flowing between an external drain terminal D and an external source terminal S is controlled in accordance with a control voltage applied between an external gate terminal G and the external source terminal S. In addition, the semiconductor device has a main MOSFET 1 and a detecting MOSFET 2 each of which is inserted between the external drain terminal D and the external source terminal S, a protective circuit 3 which protects the main MOSFET 1 by a protective transistor 5 when the abnormality is detected thereby, and an impedance element 4 inserted between the protective MOSFET 5, and a junction connecting the external gate terminal G to a gate electrode of the detecting MOSFET 2.

15 Claims, 7 Drawing Sheets

SEMICONDUCTOR DEVICE WITH PROTECTIVE FUNCTIONS

TECHNICAL FIELD

The present invention relates to a semiconductor device with protective functions, which can operate with a very small gate driving current and further automatically dissolve its protective function when abnormality of a main transistor has run out.

BACKGROUND ART

A semiconductor device with protective functions having a circuit construction, for example shown in FIG. 11, is conventionally known. The semiconductor device with protective functions shown in FIG. 11, which is one of three-terminal semiconductor devices, is provided with an external drain terminal (first main terminal) D, an external source terminal (second main terminal) S and an external gate terminal (control terminal) G. The semiconductor device is inserted between a power source and a load. In the semiconductor device, a current flowing between the external drain terminal D and the external source terminal S is controlled in accordance with a control voltage applied between the external gate terminal G and the external source terminal S.

The semiconductor device shown in FIG. 11 is provided with a main MOSFET 1 which is turned to ON or OFF in accordance with the control voltage and which is inserted between the external drain terminal D and the external source terminal S, and a protective circuit 3' for protecting the main MOSFET 1. Hereupon, the protective circuit 3' is provided with a protective MOSFET 5' inserted between the gate electrode and the source electrode of the main MOSFET 1, a diode array 31 acting as a temperature detector which is thermally connected with the main MOSFET 1, another MOSFET 35 connected to the diode array 31 at each of the gate electrode and the source electrode thereof, further MOSFETs 37 and 38 connected to each other in such a manner that the drain electrode of the MOSFET 37 is connected to the gate electrode of the MOSFET 38, and a further MOSFET 36 inserted between the drain electrode and source electrode of the MOSFET 37, the gate electrode of the MOSFET 36 being connected to the drain electrode of the MOSFET 35. According to the circuit construction, when the temperature detected by the diode array 31 rises to or over a predetermined value, the main MOSFET 1 is shut, and then the shut state of the main MOSFET 1 is maintained till the input to the external gate terminal G is reset. That is, when the temperature detected by the diode array 31 rises to or over the predetermined value, the gate voltage of the MOSFET 35 becomes lower than a threshold voltage. In consequence, the MOSFET 35 becomes OFF, the MOSFET 36 becomes ON, and each of the MOSFETs 37 and 38 becomes OFF. As the result, the protective MOSFET 5' becomes ON so that the gate electrode and source electrode of the main MOSFET 1 short-circuit, and then the main MOSFET 1 becomes OFF.

In the conventional semiconductor device with protective functions described above, the protective circuit 3' operates using the voltage applied to the gate electrode of the MOSFET 1 as its power source. Accordingly, it is necessary to supply the power to both of the protective circuit 3' and the main MOSFET 1. In that case, for example, there is required a driver which can supply a gate driving current of at least 0.1 mA. In consequence, there occurs such a disadvantage that it is difficult to drive the semiconductor device using electromotive force of a photovoltaic element which can supply only a very small gate driving current, or to drive the semiconductor device using power obtained by rectifying an alternating signal which is transmitted through capacitors.

Meanwhile, in the conventional semiconductor device with protective functions described above, if the temperature detected by the diode array 31 rises to or over the predetermined value when the main MOSFET 1 is overheated, the main MOSFET 1 is shut. The shut state of the main MOSFET 1 is maintained till the input to the external gate terminal G is reset. Therefore, when the semiconductor device is restarted (returned), the control voltage applied to the external gate terminal G is required to be reset as 0 V.

Hereupon, it is also possible to perform two-directional switching by providing two semiconductor devices with protective functions shown in FIG. 11, and then commonly connecting the external source terminals S to each other while commonly connecting the external gate terminals G to each other. However, in this case, it is feared that when the current flows from the external source terminal S to the external drain terminal D, the protective MOSFET 5' of the protective circuit 3' may operate in error.

DISCLOSURE OF THE INVENTION

The present invention, which has been developed to solve the conventional problems described above, has an object to provide a semiconductor device with protective functions which can operate with a very small gate driving current and further automatically dissolve its protective function (or protected state) when abnormality of a main transistor has run out.

A semiconductor device with protective functions according to the first aspect of the present invention, inserted between a power source and a load, in which an electric current flowing between a first main terminal and a second main terminal is controlled in accordance with a control voltage applied between a control terminal and the second main terminal, is characterized in that it includes (i) a main transistor of a voltage driven type which is turned to ON or OFF in accordance with the control voltage, the main transistor being inserted between the first main terminal and the second main terminal, (ii) a protective transistor of a voltage driven type inserted between a control electrode of the main transistor and a reference electrode of the main transistor, (iii) a protective circuit which protects the main transistor by the protective transistor when abnormality is detected thereby, the protective circuit being inserted between the first main terminal and the second main terminal, (iv) a detecting transistor of a voltage driven type which is turned to ON or OFF in accordance with the control voltage, the detecting transistor being inserted between the first main terminal and the protective circuit, and (v) an impedance element inserted between the protective transistor and a junction connecting the control terminal to a control electrode of the detecting transistor, wherein (vi) power is supplied from the power source to the protective circuit through the first main terminal and the detecting transistor.

According to the semiconductor device, through the first main terminal and the detecting transistor, the power is supplied from the power source to the protective circuit inserted between the first main terminal and the second main terminal, which protects the main transistor by the protective transistor when the abnormality is detected thereby.

Accordingly, it is not necessary to supply the power from the driver to both of the protective circuit and the main transistor, as different from the conventional case. In consequence, the semiconductor device can operate with a very small gate driving current. Meanwhile, when the abnormality of the main transistor has run out, the protective function, which has protected the main transistor, is automatically dissolved.

Further, because each of the transistors constituting the semiconductor device is not one of a current driven type such as a bipolar transistor, but one of a voltage driven type, the transistors can be formed on one single (same) substrate.

A semiconductor device with protective functions according to the second aspect of the present invention is characterized in that in the semiconductor device according to the first aspect, it further includes a non-return diode inserted between the second main terminal and a junction connecting the protective circuit to a reference electrode of the protective transistor, in such a manner that the non-return diode has polarity to prevent a current from flowing from the second main terminal to the protective transistor and the protective circuit.

According to the semiconductor device, when the current flows from the second main terminal to the first main terminal, it may be prevented that the current flows into the protective circuit. In consequence, it may be prevented that the protective circuit operates in error.

A semiconductor device with protective functions according to the third aspect of the present invention has two semiconductor device components inserted between a power source and a load, in each of which an electric current flowing between a first main terminal and a second main terminal is controlled in accordance with a control voltage applied between a control terminal and the second main terminal, the second main terminals of the two semiconductor device components being commonly connected to each other, and the control terminals of the two semiconductor device components being commonly connected to each other. Each of the semiconductor device components is characterized in that it includes (i) a main transistor of a voltage driven type which is turned to ON or OFF in accordance with the control voltage, the main transistor being inserted between the first main terminal and the second main terminal, (ii) a protective transistor of a voltage driven type inserted between a control electrode of the main transistor and a reference electrode of the main transistor, (iii) a protective circuit which protects the main transistor by the protective transistor when abnormality is detected thereby, the protective circuit being inserted between the first main terminal and the second main terminal, (iv) a detecting transistor of a voltage driven type which is turned to ON or OFF in accordance with the control voltage, the detecting transistor being inserted between the first main terminal and the protective circuit, (v) an impedance element inserted between the protective transistor and a junction connecting the control terminal to a control electrode of the detecting transistor, and (vi) a non-return diode inserted between the second main terminal and a junction connecting the protective circuit to a reference electrode of the protective transistor, in such a manner that the non-return diode has polarity to prevent a current from flowing from the second main terminal to the protective transistor and the protective circuit.

According to the semiconductor device, when the two-directional switching is performed, it may be prevented that the protective circuit operates in error. Meanwhile, through the first main terminal and the detecting transistor, the power is supplied from the power source to the protective circuit inserted between the first main terminal and the second main terminal, which protects the main transistor by the protective transistor when the abnormality is detected thereby. Accordingly, it is not necessary to supply the power from the driver to both of the protective circuit and the main transistor, as different from the conventional case. In consequence, the semiconductor device can operate with a very small gate driving current. Meanwhile, when the abnormality of the main transistor has run out, the protective function, which has protected the main transistor, is automatically dissolved.

In the semiconductor device according to the third aspect of the present invention, it is preferable that the device further includes (a) a light emitting element which is turned on or turned off in accordance with a signal inputted thereto, and (b) a photovoltaic element which is optically coupled with the light emitting element to generate electromotive force, wherein (c) the electromotive force is applied between the control terminal and the second main terminal. In that case, the input terminal and the output terminal may be insulated to each other.

In the semiconductor device according to the third aspect of the present invention, it is also preferable that a voltage obtained by rectifying an alternating signal is applied between the control terminal and the second main terminal. In that case, the input terminal and the output terminal may be insulated to each other for a direct current.

In the semiconductor device according to the first aspect of the present invention, it is also preferable that (a) for each of the main transistor, the detecting transistor and the protective transistor, conductivity between a one side electrode and a further side electrode acting as a reference electrode is actuated (driven) by a potential difference between the further side electrode and a control electrode, (b) the protective circuit including a thermosensible (i.e. heat sensible) element with a negative temperature characteristic, which is composed of semiconductor, the thermosensible element being thermally connected with the main transistor, and a protective circuit transistor of a voltage driven type, its one side electrode being connected to the control electrode of the protective transistor, its further side electrode being connected to one end portion of the thermosensible element and the further side electrode of the protective transistor, and its control electrode being connected to the other end portion of the thermosensible element, wherein (c) the protective circuit transistor is inserted between the first main terminal and the second main terminal so as to be provided with a power through the detecting transistor, the control electrode of the protective circuit transistor being connected in such a manner that conductivity between its both side electrodes is shut in accordance with a potential rise between the first main terminal and the second main terminal. In this case, it is more preferable that the semiconductor device further includes a non-return diode inserted between the second main terminal and the further electrode of each of the protective transistor and the protective circuit transistor, in such a manner that the non-return diode has polarity to prevent a current from flowing from the second main terminal to the protective transistor and the protective circuit. Hereupon, each of the main transistor, the detecting transistor and the protective transistor may be composed of a MOSFET having a drain electrode as the one side electrode, a source electrode as the further side electrode and a gate electrode as the control electrode.

In the semiconductor device according to the first aspect of the present invention, it is also preferable that (a) the detecting transistor is composed of two or more detecting transistor components, while (b) for each of the main transistor, the detecting transistor components and the protective transistor, conductivity between a one side electrode and a further side electrode acting as a reference electrode is actuated (driven) by a potential difference between the further side electrode and a control electrode, (c) the protective circuit including a thermosensible element with a negative temperature characteristic, which is composed of semiconductor, the thermosensible element being thermally connected with the main transistor, and a protective circuit transistor of a voltage driven type, its one side electrode being connected to the control electrode of the protective transistor, its further side electrode being connected to one end portion of the thermosensible element and the further side electrode of the protective transistor, and its control electrode being connected to the other end portion of the thermosensible element, wherein (d) the protective circuit transistor is inserted between the first main terminal and the second main terminal so as to be provided with a power through any one of the detecting transistor components, the control electrode of the protective circuit transistor being connected in such a manner that conductivity between its both side electrodes is shut in accordance with a potential rise between the first main terminal and the second main terminal. In this case, it is more preferable that the semiconductor device further includes a non-return diode inserted between the second main terminal and the further electrode of each of the protective transistor and the protective circuit transistor, in such a manner that the non-return diode has polarity to prevent a current from flowing from the second main terminal to the protective transistor and the protective circuit. Hereupon, each of the main transistor, the detecting transistor components and the protective transistor may be composed of a MOSFET having a drain electrode as the one side electrode, a source electrode as the further side electrode and a gate electrode as the control electrode.

In the semiconductor device according to the first aspect of the present invention, it is also preferable that (a) each of the main transistor, the detecting transistor and the protective transistor is composed of a MOSFET, while (b) the protective circuit includes second, third and fourth impedance elements, each of which is commonly connected to a source electrode of the detecting transistor at one end portion thereof, first, second and third MOSFETs, each of which is commonly connected to the second main terminal at a source electrode thereof, and a diode array which is thermally connected with the main transistor and inserted between a drain electrode of the second MOSFET and the source electrode of the second MOSFET in such a manner that an anode side of the diode array is connected to the drain electrode of the second MOSFET, wherein (c) a further end portion of the second impedance element is connected to a drain electrode of the first MOSFET, a further end portion of the third impedance element being connected to the drain electrode of the second MOSFET, a further end portion of the fourth impedance element being connected to a drain electrode of the third MOSFET, a gate electrode of the first MOSFET being connected to the drain electrode of the second MOSFET, a gate electrode of the second MOSFET being connected to the drain electrode of the third MOSFET, a gate electrode of the third MOSFET being connected to the drain electrode of the first MOSFET, a gate electrode of the protective transistor being connected to the drain electrode of the first MOSFET, a source electrode of the protective transistor being connected to a source electrode of the main transistor, and a drain electrode of the protective transistor being connected to a gate electrode of the main transistor. In this case, if each of the impedance elements and each of diodes constituting the diode array are formed utilizing materials of the gate electrodes of the MOSFETs, the diode array, each of the impedance elements and each of the MOSFETs can be formed on one single substrate by means of a simple process.

In the semiconductor device according to the second aspect of the present invention, it is also preferable that (a) each of the main transistor, the detecting transistor and the protective transistor is composed of a MOSFET, while (b) the protective circuit includes second, third and fourth impedance elements, each of which is commonly connected to a source electrode of the detecting transistor at one end portion thereof, first, second and third MOSFETs, each of which is commonly connected to an anode of the non-return diode at a source electrode thereof, and a diode array which is thermally connected with the main transistor and inserted between a drain electrode of the second MOSFET and a source electrode of the main transistor in such a manner that an anode side of the diode array is connected to the drain electrode of the second MOSFET, wherein (c) a further end portion of the second impedance element is connected to a drain electrode of the first MOSFET, a further end portion of the third impedance element being connected to the drain electrode of the second MOSFET, a further end portion of the fourth impedance element being connected to a drain electrode of the third MOSFET, a gate electrode of the first MOSFET being connected to the drain electrode of the second MOSFET, a gate electrode of the second MOSFET being connected to the drain electrode of the third MOSFET, a gate electrode of the third MOSFET being connected to the drain electrode of the first MOSFET, a gate electrode of the protective transistor being connected to the drain electrode of the first MOSFET, a source electrode of the protective transistor being connected to the source electrode of the main transistor through the non-return diode, and a drain electrode of the protective transistor being connected to a gate electrode of the main transistor. In this case, if the non-return diode, each of the impedance elements and each of diodes constituting the diode array are formed utilizing materials of the gate electrodes of the MOSFETs, these can be formed on one single substrate by means of a simple process.

In the semiconductor device according to the first aspect of the present invention, it is also preferable that (a) the detecting transistor is composed of a first detection transistor and a second detection transistor, (b) each of the main transistor, the first detection transistor, the second detection transistor and the protective transistor being composed of a MOSFET, (c) the impedance element being defined as a first impedance element, (d) the protective circuit including second and third impedance elements, each of which is commonly connected to a source electrode of the first detection transistor at one end portion thereof, first and second MOSFETs, each of which is commonly connected to a source electrode of the main transistor at a source electrode thereof, a diode array which is thermally connected with the main transistor and inserted between a drain electrode of the second MOSFET and the source electrode of the second MOSFET in such a manner that an anode side of the diode array is connected to the drain electrode of the second MOSFET, and a fourth impedance element which is connected to a source electrode of the second detection transistor at one end portion thereof and to the source electrode of the main transistor at a further end portion thereof, wherein (e) a further end portion of the second impedance element is connected to a drain electrode of the first MOSFET, a further end portion of the third impedance element being connected to the drain electrode of the second MOSFET, a gate electrode of the first MOSFET being connected to the drain electrode of the second MOSFET, a gate electrode of the second MOSFET being connected to the source electrode of the second detection transistor, a gate electrode of the protective transistor being connected to the drain electrode of the first MOSFET, a source electrode of the protective transistor being connected to the source electrode of the main transistor, a drain electrode of the protective transistor being connected to a gate electrode of the main transistor, a gate electrode of the first detection transistor being connected to the gate electrode of the main transistor through the first impedance element, and a gate electrode of the second detection transistor being connected to the gate electrode of the main transistor. In this case, if each of the impedance elements and each of diodes constituting the diode array are formed utilizing materials of the gate electrodes of the MOSFETs, these can be formed on one single substrate by means of a simple process.

In the semiconductor device according to the second aspect of the present invention, it is also preferable that (a) the detecting transistor is composed of a first detection transistor and a second detection transistor, (b) each of the main transistor, the first detection transistor, the second detection transistor and the protective transistor being composed of a MOSFET, (c) the impedance element being defined as a first impedance element, (d) the protective circuit including second and third impedance elements, each of which is commonly connected to a source electrode of the first detection transistor at one end portion thereof, first and second MOSFETs, each of which is commonly connected to an anode of the non-return diode at a source electrode thereof, a diode array which is thermally connected with the main transistor and inserted between a drain electrode of the second MOSFET and a source electrode of the main transistor in such a manner that an anode side of the diode array is connected to the drain electrode of the second MOSFET, and a fourth impedance element which is connected to a source electrode of the second detection transistor at one end portion thereof and to the source electrode of the main transistor at a further end portion thereof, wherein (e) a further end portion of the second impedance element is connected to a drain electrode of the first MOSFET, a further end portion of the third impedance element being connected to the drain electrode of the second MOSFET, a gate electrode of the first MOSFET being connected to the drain electrode of the second MOSFET, a gate electrode of the second MOSFET being connected to the source electrode of the second detection transistor, a gate electrode of the protective transistor being connected to the drain electrode of the first MOSFET, a source electrode of the protective transistor being connected to the source electrode of the main transistor through the non-return diode, a drain electrode of the protective transistor being connected to a gate electrode of the main transistor, a gate electrode of the first detection transistor being connected to the gate electrode of the main transistor through the first impedance element, and a gate electrode of the second detection transistor being connected to the gate electrode of the main transistor. In this case, if the non-return diode, each of the impedance elements and each of diodes constituting the diode array are formed utilizing materials of the gate electrodes of the MOSFETs, these can be formed on one single substrate by means of a simple process.

In the semiconductor device according to the first or second aspect of the present invention, it is preferable that the main transistor, the detecting transistor, the protective transistor, the protective circuit and the impedance element are formed on one substrate. In this case, the size of the semiconductor device may be reduced in comparison with such a case that it is constructed by combining discrete parts. Moreover, characteristics of the elements constituting the semiconductor device may be uniformed. Meanwhile, when each of the main transistor, the detecting transistor and the protective transistor is formed as a MOSFET, each of the impedance elements can be formed using polycrystalline silicon which is a material of the gate electrodes of the MOSFETs. In consequence, the process for manufacturing the semiconductor device may be simplified. In addition, when the diode array is provided in the protective circuit, for example as an element for detecting the temperature, each of diodes constituting the diode array can be formed using polycrystalline silicon, which is a material of the gate electrodes of the MOSFETs.

BRIEF DESCRIPTION OF DRAWINGS

The present invention will be more sufficiently understood from the detailed explanation described below and the accompanying drawings, and in which.

BEST MODE FOR CARRYING OUT THE INVENTION

This application is based on the patent application No. 2000-300894 filed in Japan, the contents of which are hereby incorporated by reference.

(Embodiment 1)

Hereinafter, Embodiment 1 of the present invention will be described.

Figure 1:
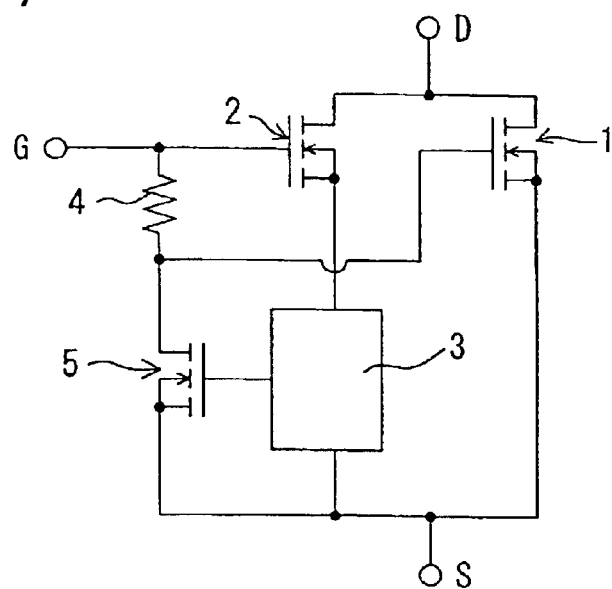
FIG. 1 is a rough circuit diagram of a semiconductor device with protective functions according to Embodiment 1 of the present invention.

As shown in FIG. 1, the semiconductor device with protective functions according to Embodiment 1, which is one of three-terminal semiconductor devices, is provided with an external drain terminal D, an external source terminal S and an external gate terminal G. The semiconductor device is inserted between a power source and a load. In the semiconductor device, a current flowing between the external drain terminal D and the external source terminal S is controlled in accordance with a control voltage applied between the external gate terminal G and the external source terminal S. In Embodiment 1, the external drain terminal D composes the first main terminal, the external source terminal S composing the second main terminal, and the external gate terminal G composing the control terminal.

The semiconductor device is provided with a main MOSFET 1, a detecting MOSFET 2, a protective circuit 3, a first impedance element 4 and a protective MOSFET 5. The main MOSFET 1 is inserted between the external drain terminal D and the external source terminal S while it is turned to ON or OFF (i.e. becomes ON or OFF) in accordance with the control voltage. The protective MOSFET 5 is inserted between the gate electrode (control electrode) and the source electrode (reference electrode) of the main MOSFET 1. The protective circuit 3, which is inserted between the external drain terminal D and the external source terminal S, protects the main MOSFET 1 by the protective MOSFET 5 when abnormality is detected thereby. The detecting MOSFET 2, which is inserted between the external drain terminal D and the protective circuit 3, is turned to ON or OFF (i.e. becomes ON or OFF) in accordance with the control voltage. The first impedance element 4, which is composed of a resistance member, is inserted between the protective MOSFET 5 and a junction (or point) connecting the external gate terminal G to the gate electrode (control electrode) of the detecting MOSFET 2.

Hereupon, the power (electrical power) is supplied from the power source to the protective circuit 3 through the external drain terminal D and the detecting MOSFET 2. In Embodiment 1, the main MOSFET 1 composes the main transistor of the voltage driven type, the detecting MOSFET 2 composing the detecting transistor of the voltage driven type, and the protective MOSFET 5 composing the protective transistor.

Figure 2:
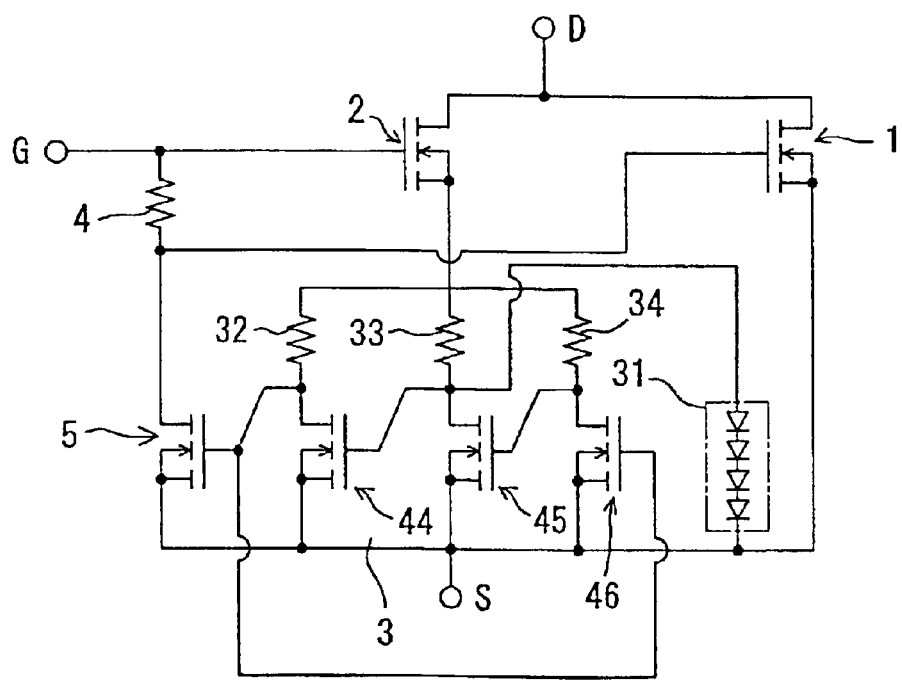
FIG. 2 is a concrete circuit diagram of the semiconductor device shown in FIG. 1.

FIG. 2 shows the circuit shown in FIG. 1 more concretely. The protective circuit 3 is provided with a diode array 31, second to fourth impedance elements 32–34 and first to third MOSFETs 44–46. Each of the second to fourth impedance elements 32–34, which is composed of a resistance member, is commonly connected to the source electrode of the detecting MOSFET 2 at one end portion thereof. Each of the first to third MOSFETs 44–46 is commonly connected to the external source terminal S at the source electrode thereof. Hereupon, the first MOSFET 44 composes the protective circuit transistor. The diode array 31, which is thermally connected with the main MOSFET 1, is inserted between the drain electrode and the source electrode of the second MOSFET 45 in such a manner that the anode side of the diode array 31 is connected to the drain electrode of the second MOSFET 45.

In the protective circuit 3, the other end portion of the second impedance element 32 is connected to the drain electrode of the first MOSFET 44. The other end portion of the third impedance element 33 is connected to the drain electrode of the second MOSFET 45. The other end portion of the fourth impedance element 34 is connected to the drain electrode of the third MOSFET 46. The gate electrode of the first MOSFET 44 is connected to the drain electrode of the second MOSFET 45. The gate electrode of the second MOSFET 45 is connected to the drain electrode of the third MOSFET 46. The gate electrode of the third MOSFET 46 is connected to the drain electrode of the first MOSFET 44.

The gate electrode (control electrode) of the protective MOSFET 5 is connected to the drain electrode of the first MOSFET 44. The source electrode (reference electrode) of the protective MOSFET 5 is connected to the source electrode of the main MOSFET 1. The drain electrode of the protective MOSFET 5 is connected to the gate electrode of the main MOSFET 1.

Hereinafter, the operation of the semiconductor device with protective functions according to Embodiment 1 will be described. When the control voltage is not applied between the external gate terminal G and the external source terminal S, both of the main MOSFET 1 and the detecting MOSFET 2 are OFF so that the current does not flow between the external drain terminal D and the external source terminal S. That is, the load current does not flow.

On the other hand, when the control voltage is applied between the external gate terminal G and the external source terminal S, each of the main MOSFET 1 and the detecting MOSFET 2 becomes ON if the gate voltage (i.e. voltage between the gate electrode and the source electrode) of each of the main MOSFET 1 and the detecting MOSFET 2 is equal to or higher than its threshold value. In consequence, the load current flows between the external drain terminal D and the external source terminal S. Hereupon, if the application of the control voltage between the external gate terminal G and the external source terminal S is stopped, each of the main, MOSFET 1 and the detecting MOSFET 2 becomes OFF. In this case, the external drain terminal D and the external source terminal S are shut to each other so that the load current does not flow.

The protective circuit 3 is provided with the impedance elements 32 to 34 and the MOSFETs 44 to 46, which are connected in the manner shown in FIG. 2. The constant of each of the impedance elements 32 to 34 is set in such a manner that oscillation is caused utilizing parasitic capacitance of each of the MOSFETs 44 to 46 when voltage equal to or higher than the specified voltage is applied between the external drain terminal D and the external source terminal S. Therefore, in the protective circuit 3, each of the MOSFETs 44 to 46 starts to oscillate if voltage higher than the specified voltage is applied between the external drain terminal D and the external source terminal S so that the voltage caused between the source electrode of the detecting MOSFET 2 and the external source terminal S becomes equal to or higher than the threshold value of the gate voltage of each of the MOSFETs 44 to 46, when the control voltage is applied between the external gate terminal G and the external source terminal S so that the main MOSFET 1 and the detecting MOSFET 2 become ON. Thus, the protective MOSFET 5 performs (repeats) ON/OFF operation.

Hereupon, when the protective MOSFET 5 is ON, the gate electrode and the source electrode of the main MOSFET 1 short-circuit to each other so that the main MOSFET 1 becomes OFF. On the other hand, when the protective MOSFET 5 is OFF, the main MOSFET 1 becomes ON. That is, if voltage equal to or higher than the specified voltage is applied between the external drain terminal D and the external source terminal S when the main MOSFET 1 and the detecting MOSFET 2 are ON, the protective circuit 3 makes the main MOSFET 1 perform the ON/OFF operation through the protective MOSFET 5. In consequence, the current flowing through the main MOSFET 1 is limited so that the main MOSFET 1 is protected.

Meanwhile, in the protective circuit 3, the diode array 31 is thermally connected with the main MOSFET 1.

Hereupon, the forward voltage of each of the diodes constituting the diode array 31 has a negative temperature characteristic. In consequence, if the main MOSFET 1 generates heat so that its temperature rises, the end-to-end voltage of the diode array 31 lowers. Hereupon, when the end-to-end voltage of the diode array 31 lowers below the threshold voltage of the first MOSFET 44, the first MOSFET 44 maintains OFF. In consequence, the protective MOSFET 5 maintains ON, and then the gate electrode and the source electrode of the main MOSFET 1 short-circuit to each other so that the main MOSFET 1 maintains OFF.

In that case, the detecting MOSFET 2 maintains ON if the protective MOSFET 5 is ON, because the first impedance element 4 is inserted between the drain electrode of the protective MOSFET 5 and the junction connecting the external gate terminal G to the gate electrode of the detecting MOSFET 2. Hereupon, when the main MOSFET 1 becomes OFF and then the temperature of the main MOSFET 1 lowers so that the end-to-end voltage of the diode array 31 becomes a voltage equal to or high than the threshold voltage of the second MOSFET 45, each of the MOSFETs 44 to 46 restarts to oscillate. As the result, the main MOSFET 1 also repeats its ON/OFF operation.

Thus, the voltage between the external drain terminal D and the external source terminal S lowers below the specified voltage, the action of the detective circuit 3 is stopped so that the main MOSFET 1 becomes ON. Hereupon, when both of the main MOSFET 1 and the detecting MOSFET 2 are ON in the steady state, the current flowing through the detecting MOSFET 2 is sufficiently smaller in comparison with the current flowing through the main MOSFET 1. Therefore, the power applied to the detecting MOSFET 2 is sufficiently smaller in comparison with the power applied to the main MOSFET 1.

That is, the protective circuit 3 has the following functions. In Embodiment 1, the diode array 31 composes the temperature detecting section.

(a) First protective function: When voltage equal to or higher than the specified voltage is applied between the external drain terminal D and the external source terminal S (i.e. When over-current flows through the main MOSFET 1) in the state that the main MOSFET 1 is ON, the protective circuit 3 oscillates to make the protective MOSFET 5 perform its ON/OFF operation, thereby making the main MOSFET 1 perform its ON/OFF operation to protect the main MOSFET 1.

(b) Second protective function: When the temperature detected by the diode array 31 rises to or over a predetermined value (temperature where the end-to-end voltage of the diode array 31 reaches the threshold voltage of the first MOSFET 44), the protective circuit 3 makes the protective MOSFET 5 maintain ON, thereby making the main MOSFET 1 maintain OFF to protect the main MOSFET 1.

(c) Self-returning function: When the detected temperature lowers below the predetermined value (i.e. When the end-to-end voltage of the diode array 31 becomes lower than the threshold voltage of the first MOSFET 44), the second protective function for protecting the main MOSFET 1 is automatically dissolved.

Figure 11:
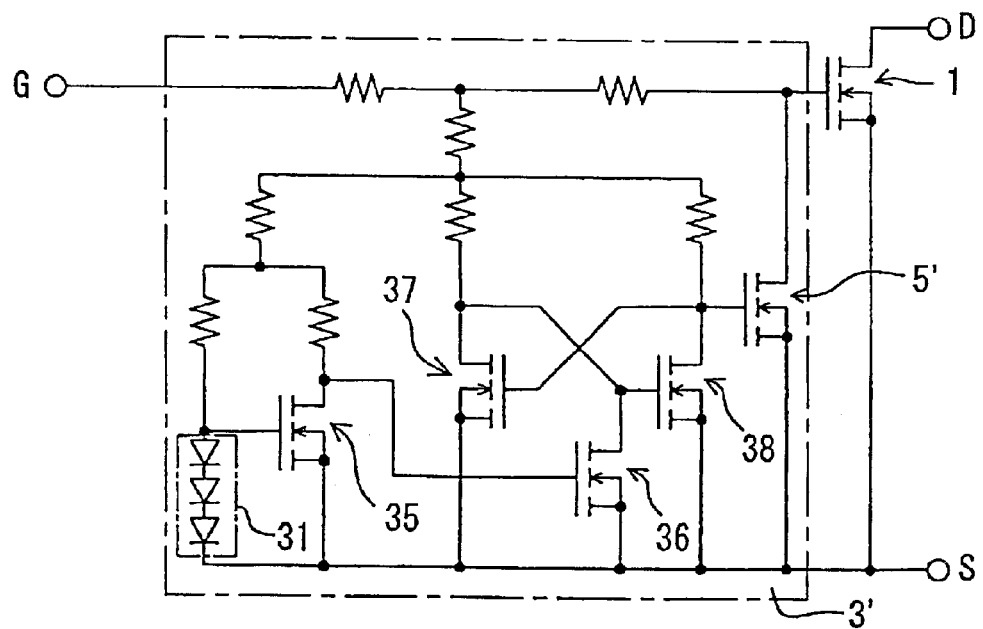
FIG. 11 is a circuit diagram of a conventional semiconductor device with protective functions.

As described above, in the semiconductor device with protective functions according to Embodiment 1, through the external drain terminal D and the detecting MOSFET 2, the power is supplied from the power source to the protective circuit 3 inserted between the external drain terminal D and the external source terminal S, which protects the main MOSFET 1 by the protective MOSFET 5 when the abnormality is detected thereby. Accordingly, it is not necessary to supply the power from the driver to both of the protective circuit 3 and the main MOSFET 1, as different from the conventional semiconductor device with protective functions shown in FIG. 11. In consequence, the semiconductor device according to Embodiment 1 can operate with a very small gate driving current. Meanwhile, when the abnormality of the main MOSFET 1 has run out, the protective function, which has protected the main MOSFET 1, is automatically dissolved.

Figure 3:
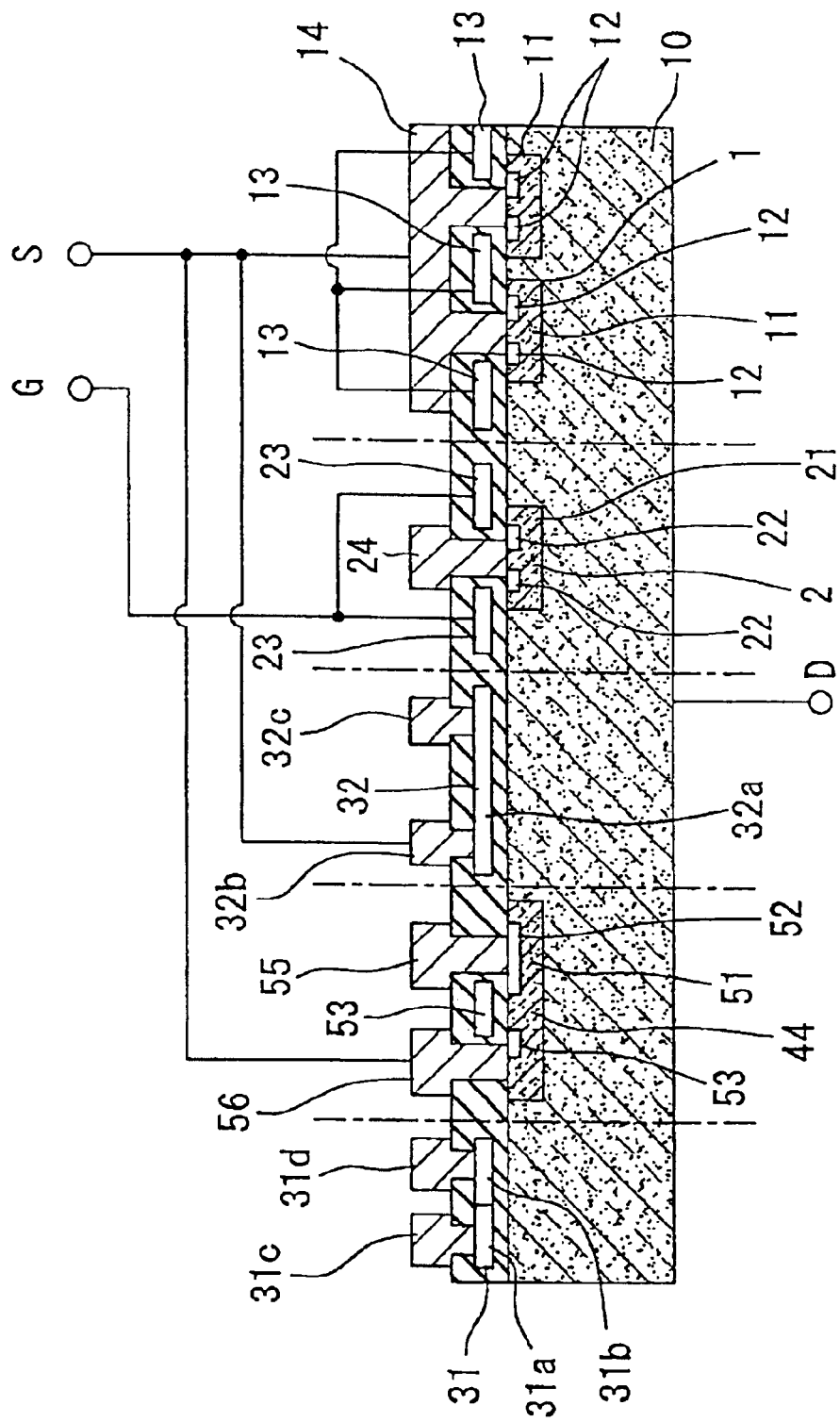
FIG. 3 is a sectional elevation view of the semiconductor device shown in FIG. 1.

As shown in FIG. 3, in the semiconductor device with protective functions according to Embodiment 1, the main MOSFET 1, the detecting MOSFET 2, the protecting circuit 3, the first impedance element 4 and the protective MOSFET 5 are formed together on one n-type silicon substrate 10. Although the protective MOSFET 5 and the second and third MOSFETs 45 and 46 are not shown in FIG. 3, the construction of each of these MOSFETs is as same as the construction of the first MOSFET 44. Although the first, third and fourth impedance elements 4, 33 and 34 are also not shown in FIG. 3, the construction of each of these elements is as same as the construction of the second impedance element 32. Further, on the back surface of the n-type silicon substrate 10, there is formed a drain electrode (not shown) which is connected to the external drain terminal D.

In the main MOSFET 1 of the semiconductor device, a lot of small signal MOSFETs are connected to one another in parallel. In each of the small signal MOSFETs, a source region 12 is formed within a p-type well region 11 formed on the n-type silicon substrate 10. Gate electrodes 13 of the small signal MOSFETs are commonly connected to one another, while a source electrode 14 is connected to each of the source regions 12.

In the detecting MOSFET 2, a source region 22 is formed within a p-type well region 21 formed on the n-type silicon substrate 10. A source electrode 24 is connected to the source regions 22, while a gate electrode 23 is connected to the external gate terminal G.

In the first MOSFET 44, a drain region 52 and a source region 53 are formed with an interval therebetween, within a p-type well region 51 formed on the n-type silicon substrate 10. A drain electrode 55 is provided on the drain region 52, while a source electrode 56 is provided on the source region 53.

The gate electrode 13, 23 or 53 of each of the main MOSFET 1, the detecting MOSFET 2 and the first MOSFET 32 is composed of polycrystalline silicon. The second impedance element 32 includes a polycrystalline silicon layer 32a and a pair of electrodes 32b and 32c provided on the polycrystalline silicon layer 32a. Each of the diodes constituting the diode array 31 includes a polycrystalline silicon layer 31a of a first conductive type (for example, n-type), a polycrystalline silicon layer 31b of a second conductive type (for example, p-type), an electrode 31c provided on the polycrystalline silicon layer 31a and another electrode 31d provided on the polycrystalline silicon layer 31b.

According to Embodiment 1, because the main MOSFET 1, the detecting MOSFET 2, the protective MOSFET 5, the protective circuit 3 and the first impedance element 4 are formed on the single substrate 10, the size of the semiconductor device may be reduced in comparison with the case that it is constructed by combining discrete parts. Moreover, characteristics of the elements constituting the semiconductor device may be uniformed (For example, characteristics of the protective MOSFET 5 and each of the MOSFETs 44 to 46 may be uniformed.). In addition, the first impedance element 4, each of the diodes constituting the diode array 31 and each of the impedance elements 32 to 34 in the protecting curcuit 3 is composed of polycrystalline silicon which is the material of the gate electrodes of the MOSFETs. In consequence, the semiconductor device with protective functions having the circuit construction shown in FIG. 2 can be manufactured using a general technique for manufacturing a semiconductor so that the process for manufacturing the semiconductor device may be simplified. However, the semiconductor device with protective functions having the circuit construction shown in FIG. 2 may be of course constructed by combining discrete parts.

Hereupon, because each of the MOSFETs constituting the semiconductor device is not a transistor of a current driven type such as a bipolar transistor, but one of a voltage driven type, the MOSFETs can be formed on the single substrate 11.

In the case that the input capacitance of the main MOSFET 1 is larger so that the main MOSFET 1 cannot follow the oscillation of the protective circuit 3, if voltage equal to or higher than the specified voltage is applied between the external drain terminal D and the external source terminal S, the protective circuit 3 operates so as to limit the current flowing the lines between the external drain terminal D and the external source terminal S. Further, if the semiconductor device generates heat so that its temperature rises to or over a predetermined temperature, it becomes OFF. Then the temperature of the semiconductor device lowers below the predetermined temperature, the semiconductor device operates so as to self-return.

(Embodiment 2)

Hereinafter, Embodiment 2 of the present invention will be described.

Figure 4:
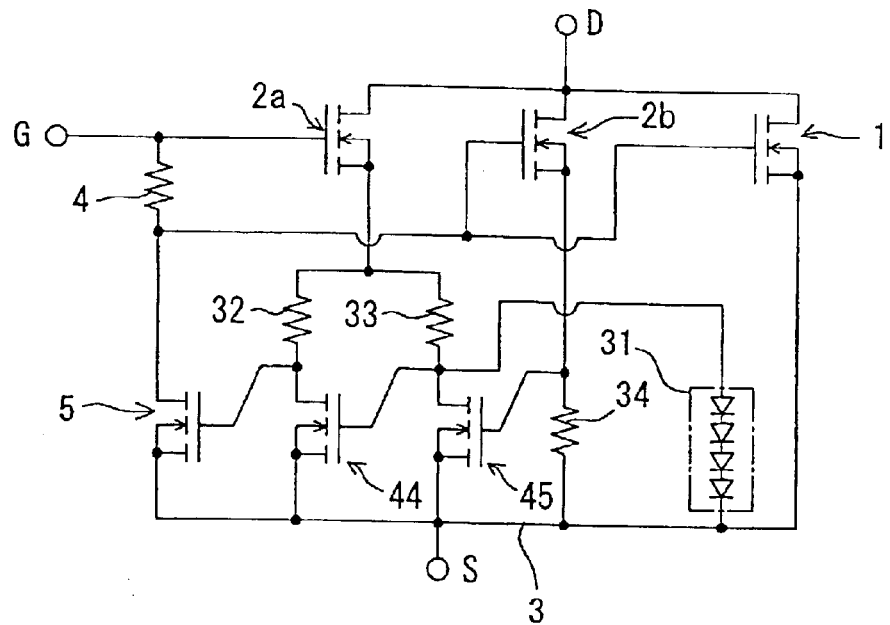
FIG. 4 is a concrete circuit diagram of a semiconductor device with protective functions according to Embodiment 2 of the present invention.

As shown in FIG. 4, the semiconductor device with protective functions according to Embodiment 2, which is one of three-terminal semiconductor devices, is provided with an external drain terminal D, an external source terminal S and an external gate terminal G. The semiconductor device is inserted between a power source and a load. In the semiconductor device, a current flowing between the external drain terminal D and the external source terminal S is controlled in accordance with a control voltage applied between the external gate terminal G and the external source terminal S. In Embodiment 2, the external drain terminal D composes the first main terminal, the external source terminal S composing the second main terminal, and the external gate terminal G composing the control terminal.

The semiconductor device is provided with a main MOSFET 1, first and second detecting MOSFETs 2a and 2b, a protective circuit 3, a first impedance element 4 and a protective MOSFET 5. The main MOSFET 1 is inserted between the external drain terminal D and the external source terminal S while it is turned to ON or OFF in accordance with the control voltage. The protective MOSFET 5 is inserted between the gate electrode (control electrode) and the source electrode (reference electrode) of the main MOSFET 1. The protective circuit 3, which is inserted between the external drain terminal D and the, external source terminal S, protects the main MOSFET 1 by the protective MOSFET 5 when abnormality is detected thereby. Each of the detecting MOSFETs 2a and 2b, which is inserted between the external drain terminal D and the protective circuit 3, is turned to ON or OFF in accordance with the control voltage. The first impedance element 4, which is composed of a resistance member, is inserted between the protective MOSFET 5 and a junction (or point) connecting the external gate terminal G to the gate electrode (control electrode) of the first detecting MOSFET 2a.

In the semiconductor device, the power is supplied from the power source to the protective circuit 3 through the external drain terminal D and the detecting MOSFETs 2a and 2b. In Embodiment 2, the main MOSFET 1 composes the main transistor of the voltage driven type, the first detecting MOSFET 2a composing the first detection transistor of the voltage driven type, the second detecting MOSFET 2b composing the second detection transistor of the voltage driven type, and the protective MOSFET 5 composing the protective transistor.

The protective circuit 3 is provided with a diode array 31, second to fourth impedance elements 32–34 and first and second MOSFETs 44 and 45. Each of the second and third impedance elements 32 and 33, which is composed of a resistance member, is commonly connected to the source electrode of the first detecting MOSFET 2a at one end portion thereof. The fourth impedance element 34, which is composed of a resistance member, is connected to the source electrode of the second detecting MOSFET 2b at one end portion thereof while it is connected to the source electrode of the main MOSFET 1 at the other end portion thereof. Each of the first and second MOSFETs 44 and 45 is commonly connected to the source electrode of the main MOSFET 1 at the source electrode thereof. The diode array 31, which is thermally connected with the main MOSFET 1, is inserted between the drain electrode and the source electrode of the second MOSFET 45 in such a manner that the anode side of the diode array 31 is connected to the drain electrode of the second MOSFET 45.

In the protective circuit 3, the other end portion of the second impedance element 32 is connected to the drain electrode of the first MOSFET 44. The other end portion of the third impedance element 33 is connected to the drain electrode of the second MOSFET 45. The gate electrode of the first MOSFET 44 is connected to the drain electrode of the second MOSFET 45. The gate electrode of the second MOSFET 45 is connected to the source electrode of the second detecting MOSFET 2b.

The gate electrode (control electrode) of the protective MOSFET 5 is connected to the drain electrode of the first MOSFET 44. The source electrode (reference electrode) of the protective MOSFET 5 is connected to the source electrode of the main MOSFET 1. The drain electrode of the protective MOSFET 5 is connected to the gate electrode of the main MOSFET 1. The gate electrode of the first detecting MOSFET 2a is connected to the gate electrode of the main MOSFET 1 through the first impedance element 4. The gate electrode of the second detecting MOSFET 2b is connected to the gate electrode of the main MOSFET 1.

Hereinafter, the operation of the semiconductor device with protective functions according to Embodiment 2 will be described. When the control voltage is not applied between the external gate terminal G and the external source terminal S, all of the main MOSFET 1 and the detecting MOSFETs 2a and 2b are OFF so that the current does not flow between the external drain terminal D and the external source terminal S. That is, the load current does not flow.

On the other hand, when the control voltage is applied between the external gate terminal G and the external source terminal S, each of the main MOSFET 1 and the detecting MOSFETs 2a and 2b becomes ON if the gate voltage (i.e. voltage between the gate electrode and the source electrode) of each of the main MOSFET 1 and the detecting MOSFETs 2a and 2b is equal to or higher than its threshold value. In consequence, the load current flows between the external drain terminal D and the external source terminal S. Hereupon, if the application of the control voltage between the external gate terminal G and the external source terminal S is stopped, each of the main MOSFET 1 and the detecting MOSFETs 2a and 2b becomes OFF. In this case, the external drain terminal D and the external source terminal S are shut to each other so that the load current does not flow.

Each of the protective MOSFET 5, the first and second MOSFETs 44 and 45 and the second detecting MOSFET 2b starts to oscillate if voltage equal to or higher than the specified voltage is applied between the external drain terminal D and the external source terminal S so that the voltage caused between the source electrode of the first detecting MOSFET 2a and the external source terminal S becomes equal to or higher than the threshold value of the gate voltage of each of the protective MOSFET 5 and the first MOSFETs 44, when the control voltage is applied between the external gate terminal G and the external source terminal S so that the main MOSFET 1 and the detecting MOSFETs 2a and 2b become ON.

Hereupon, when the protective MOSFET 5 is ON, the gate electrode and the source electrode of the main MOSFET 1 short-circuit to each other so that the main MOSFET 1 becomes OFF. On the other hand, when the protective MOSFET 5 is OFF, the main MOSFET 1 becomes ON. That is, if voltage equal to or higher than the specified voltage is applied between the external drain terminal D and the external source terminal S when the main MOSFET 1 and the detecting MOSFETs 2a and 2b are ON, the protective circuit 3 makes the main MOSFET 1 perform the ON/OFF operation through the protective MOSFET 5. In consequence, the current flowing through the main MOSFET 1 is limited so that the main MOSFET 1 is protected.

In the protective circuit 3, the diode array 31 is thermally connected with the main MOSFET 1. Hereupon, the forward voltage of each of the diodes constituting the diode array 31 has a negative temperature characteristic. In consequence, if the main MOSFET 1 generates heat so that its temperature rises, the end-to-end voltage of the diode array 31 lowers. Hereupon, when the end-to-end voltage of the diode array 31 lowers below the threshold voltage of the first MOSFET 44, the first MOSFET 44 maintains OFF. As the result, the protective MOSFET 5 maintains ON, and then the gate electrode and the source electrode of the main MOSFET 1 short-circuit to each other so that the main MOSFET 1 maintains OFF.

In that case, the first detecting MOSFET 2a maintains ON if the protective MOSFET 5 is ON, because the first impedance element 4 is inserted between the drain electrode of the protective MOSFET 5 and the junction connecting the external gate terminal G to the gate electrode of the first detecting MOSFET 2a. Hereupon, when the main MOSFET 1 becomes OFF and then the temperature of the main MOSFET 1 lowers so that the end-to-end voltage of the diode array 31 becomes equal to or high than the threshold voltage of the first MOSFET 44, each of the detective MOSFET 5, the first and second MOSFETs 44 and 45 and the second detecting MOSFET 2 restarts to oscillate. As the result, the main MOSFET 1 also repeats its ON/OFF operation.

Thus, the voltage between the external drain terminal D and the external source terminal S lowers below the specified voltage, the action of the detective circuit 3 is stopped so that the main MOSFET 1 becomes ON. Hereupon, when all of the main MOSFET 1 and the detecting MOSFETs 2a and 2b are ON in the steady state, the current flowing through each of the detecting MOSFETs 2a and 2b is sufficiently smaller in comparison with the current flowing through the main MOSFET 1.

That is, the protective circuit 3 has the first protective function, the second protective function and the self-returning function as same as those of the protective circuit 3 in Embodiment 1. In Embodiment 1 also, the diode array 31 composes the temperature detecting member.

Thus, in the semiconductor device with protective functions according to Embodiment 2, through the external drain terminal D and the detecting MOSFETs 2a and 2b, the power is supplied from the power source to the protective circuit 3 inserted between the external drain terminal D and the external source terminal S, which protects the main MOSFET 1 by the protective MOSFET 5 when the abnormality is detected thereby. Accordingly, it is not necessary to supply the power from the driver to both of the protective circuit 3 and the main MOSFET 1, as different from the conventional semiconductor device with protective functions shown in FIG. 11. In consequence, the semiconductor device according to Embodiment 2 can operate with a very small gate driving current. Meanwhile, when the abnormality of the main MOSFET 1 has run out, the protective function, which has protected the main MOSFET 1, is automatically dissolved.

The semiconductor device with protective functions according to Embodiment 2 is also formed on one substrate as same as the case of Embodiment 1, although it is not shown.

(Embodiment 3)

Hereinafter, Embodiment 3 of the present invention will be described.

Figure 5:
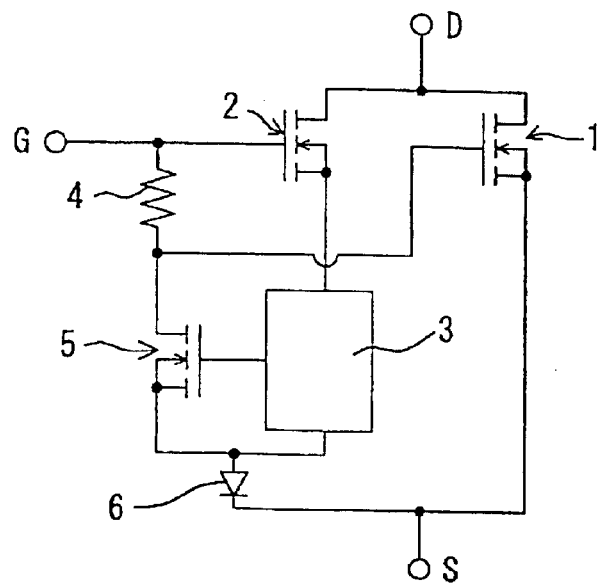
FIG. 5 is a rough circuit diagram of a semiconductor device with protective functions according to Embodiment 3 of the present invention.

As shown in FIG. 5, the fundamental construction of the semiconductor device with protective functions according to Embodiment 3 is nearly as same as that of Embodiment 1. However, the semiconductor device is provided with a non-return diode 6 inserted between the external source terminal S and a junction connecting the protective MOSFET 5 to the protective circuit 3, in such a manner that the non-return diode 6 has polarity to prevent the current from flowing from the external source terminal S to the protective MOSFET 5 and the protective circuit 3. Hereupon, each of the constructive members common with that of Embodiment 1 is given the same reference numeral as that of Embodiment 1, and then the description of the member is omitted. Further, the descriptions about operations of the above-mentioned members are also omitted, because they are as same as those of Embodiment 1.

Figure 6:
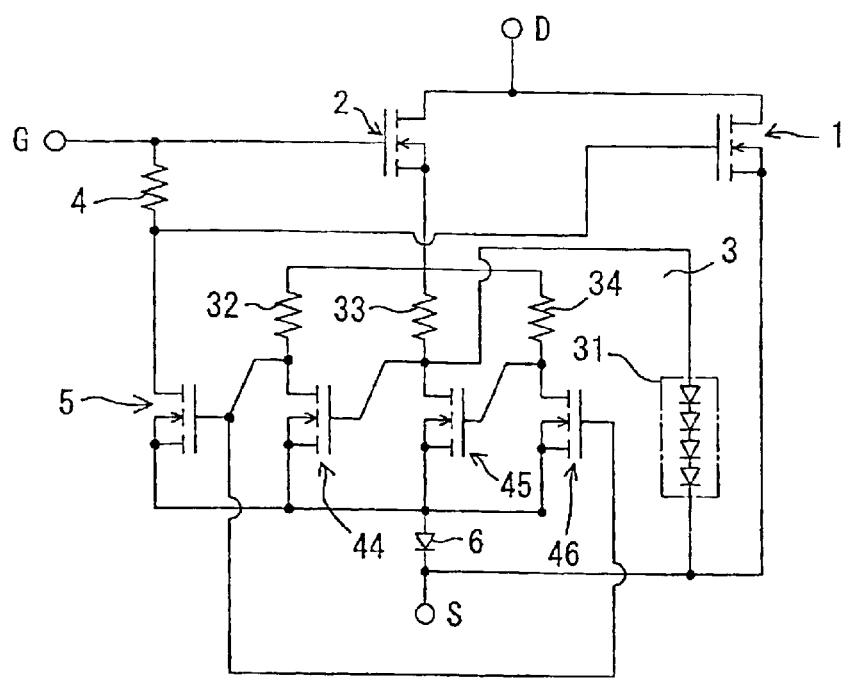
FIG. 6 is a concrete circuit diagram of the semiconductor device shown in FIG. 5.

As shown in FIG. 6, in the semiconductor device with protective functions according to Embodiment 3, the source electrode of each of the protective MOSFET 5 and the first to third MOSFETs 44–46 is commonly connected to the anode of the non-return diode 6. The cathode of the non-return diode 6 is connected to the external source terminal S. Regarding to the diode array 31, its anode side terminal is connected to the gate electrode of the first MOSFET 44, while its cathode side terminal is connected to the source electrode of the main MOSFET 1. The source electrode of the main MOSFET 1 is connected to the external source terminal S.

Figure 7:
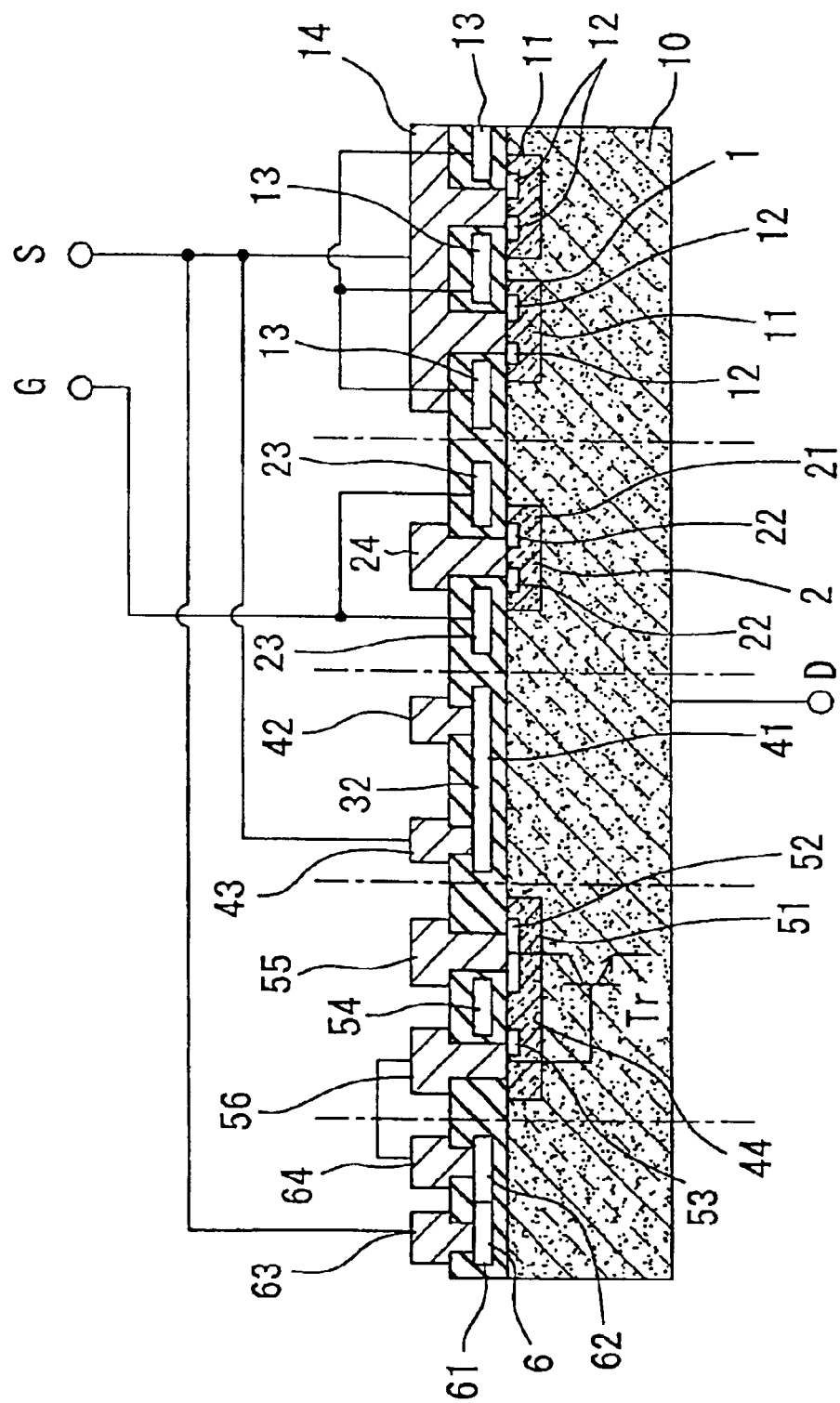
FIG. 7 is a sectional elevation view of the semiconductor device shown in FIG. 5.

As shown in FIG. 7, in the semiconductor device with protective functions according to Embodiment 3 also, the main MOSFET 1, the detecting MOSFET 2, the protecting circuit 3, the first impedance element 4, the protective MOSFET 5 and the non-return diode 6 are formed together on one n-type silicon substrate 10, nearly as same as the case of Embodiment 1.

Although the protective MOSFET 5 and the second and third MOSFETs 45 and 46 are not shown in FIG. 7, the construction of each of these MOSFETs is as same as the construction of the first MOSFET 44. Although the first, third and fourth impedance elements 4, 33 and 34 are also not shown in FIG. 7, the construction of each of these elements is as same as the construction of the second impedance element 32. Meanwhile, the construction of each of the diodes constituting the diode array 31 is also as same as that of Embodiment 1 (see FIG. 3). Further, on the back surface of the n-type silicon substrate 10, there is formed a drain electrode (not shown) which is connected to the external drain terminal D. In FIG. 7, each of the constructive members common with that of Embodiment 1 is given the same reference numeral as that of Embodiment 1.

The non-return diode 6 includes a polycrystalline silicon layer 61 of a first conductive type (for example, n-type), a polycrystalline silicon layer 62 of a second conductive type (for example, p-type), an electrode 63 provided on the polycrystalline silicon layer 61 and another electrode 64 provided on the polycrystalline silicon layer 62.

In the case that two semiconductor devices with protective functions according to Embodiment 3 are provided while their external source terminals S are commonly connected to each other, the action of the parasitic bipolar transistor of each of the MOSFETs 44–46 in the protective circuit 3 is prevented because the non-return diode 6 is provided. In FIG. 7, the parasitic bipolar transistor Tr of the first MOSFET 44 is schematically shown.

(Embodiment 4)

Hereinafter, Embodiment 4 of the present invention will be described.

Figure 8:
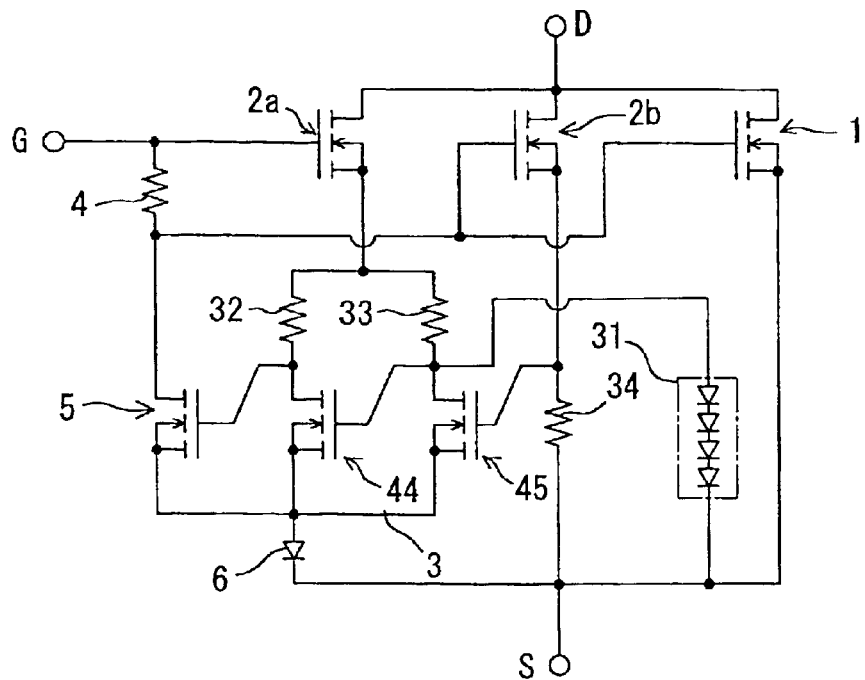
FIG. 8 is a concrete circuit diagram of a semiconductor device with protective functions according to Embodiment 4 of the present invention.

As shown in FIG. 8, the fundamental construction of the semiconductor device with protective functions according to Embodiment 4 is nearly as same as that of Embodiment 2. However, the semiconductor device is provided with a non-return diode 6 inserted between the external source terminal S and a junction connecting the protective MOSFET 5 to the protective circuit 3, in such a manner that the non-return diode 6 has polarity to prevent the current from flowing from the external source terminal S to the protective MOSFET 5 and the protective circuit 3. Hereupon, each of the constructive members common with that of Embodiment 2 is given the same reference numeral as that of Embodiment 2, and then the description of the member is omitted. Further, the descriptions about operations of the above-mentioned members are also omitted, because they are as same as those of Embodiment 2.

As apparent from FIG. 8, in the semiconductor device with protective functions according to Embodiment 4, the source electrode of each of the protective MOSFET 5 and the first and second MOSFETs 44 and 45 is commonly connected to the anode of the non-return diode 6. The cathode of the non-return diode 6 is connected to the external source terminal S. Regarding to the diode array 31, its anode side terminal is connected to the gate electrode of the first MOSFET 44, while its cathode side terminal is connected to the source electrode of the main MOSFET 1. The source electrode of the main MOSFET 1 is connected to the external source terminal S.

In the semiconductor device with protective functions according to Embodiment 4 also, the main MOSFET 1, the detecting MOSFETs 2a and 2b, the protecting circuit 3, the first impedance element 4, the protective MOSFET 5 and the non-return diode 6 are formed together on one n-type silicon substrate 10, as same as the case of Embodiment 1.

In the case that two semiconductor devices with protective functions according to Embodiment 4 are provided while their external source terminals S are commonly connected to each other, the action of the parasitic bipolar transistor of each of the first and second MOSFETs 44 and 45 in the protective circuit 3 is prevented because the non-return diode 6 is provided.

(Embodiment 5)

Hereinafter, Embodiment 5 of the present invention will be described.

Figure 9:
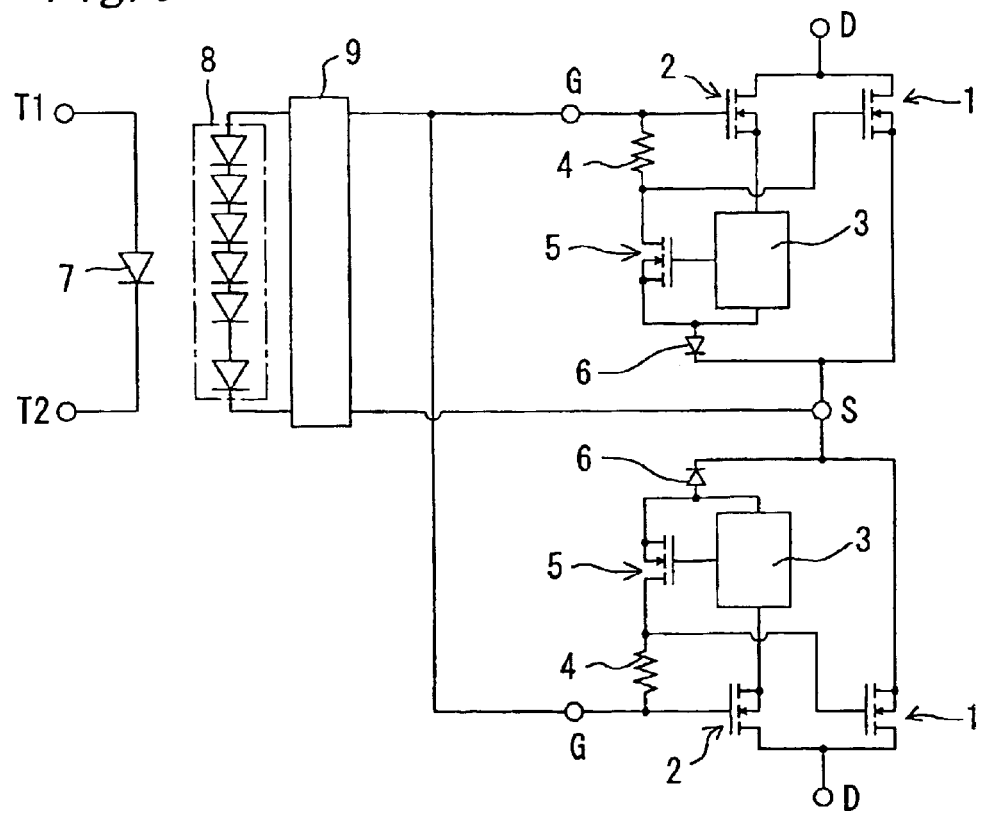
FIG. 9 is a rough circuit diagram of a semiconductor device with protective functions according to Embodiment 5 of the present invention.

As shown in FIG. 9, the semiconductor device with protective functions according to Embodiment 5 is provided with two semiconductor device components with protective functions according to Embodiment 3. Regarding to the two semiconductor device components, their external source electrodes S are commonly connected to each other, while their external gate terminals G are commonly connected to each other. Hereupon, each of the constructive members common with that of Embodiment 3 is given the same reference numeral as that of Embodiment 3, and then the description of the member is omitted.

In addition, the semiconductor device with protective functions according to Embodiment 5 is provided with a light emitting element 7 which is turned on or turned off in accordance with an input signal applied between an input terminal T1 and another input terminal T2, and a photovoltaic (or photo electromotive, photoelectric) element 8 composed of a photodiode array which is optically coupled with the light emitting element 7, to generate electromotive force (or electric power). The electromotive force (or electric power) of the photovoltaic element 8 is applied between the external gate terminals G and the external source terminals S. Further, a charge-discharge circuit 9 is provided between the both terminals of the photovoltaic element 8 and both of the external gate terminals G and the external source terminals S. When the photovoltaic element 8 generates photo electromotive force, the charge-discharge circuit 9 produces high impedance between the both terminals of the photovoltaic element 8 if the photo electromotive force of the photovoltaic element 8 reaches a predetermined voltage. On that occasion, the photo electromotive force of the photovoltaic element 8 is applied between the external gate terminal G and the external source terminal S. Meanwhile, when the photo electromotive force of the photovoltaic element 8 disappears, the charge-discharge circuit 9 forms a path, through which the electric charge stored by the gate capacity of the main MOSFET 1 is discharged, so as to lower rapidly the voltage between the external gate terminal G and the external source terminal S.

Thus, in the case that the semiconductor device with protective functions according to Embodiment 5 is provided between the power source and the load while the current flowing through between the both external drain terminals D, D is switched in the two direction, the current does not flow into the protective circuit 3 or protective MOSFET 5 connected to the anode of the non-return diode 6 even if it is designed such that the current can flow from the external source terminals S to the external drain terminals D. In consequence, it may be prevented that the protective circuit 3 or protective MOSFET 5 operates in error. Further, because the electric power is supplied from the power source to each of the protective circuits 3, the semiconductor device can operate with a very small gate driving current utilizing the photo electromotive force of the photovoltaic element 8. Meanwhile, because the light emitting element 7 and the photovoltaic element 8 are provided, the input side and the output side can be insulated to each other.

(Embodiment 6)

Hereinafter, Embodiment 6 of the present invention will be described.

Figure 10:
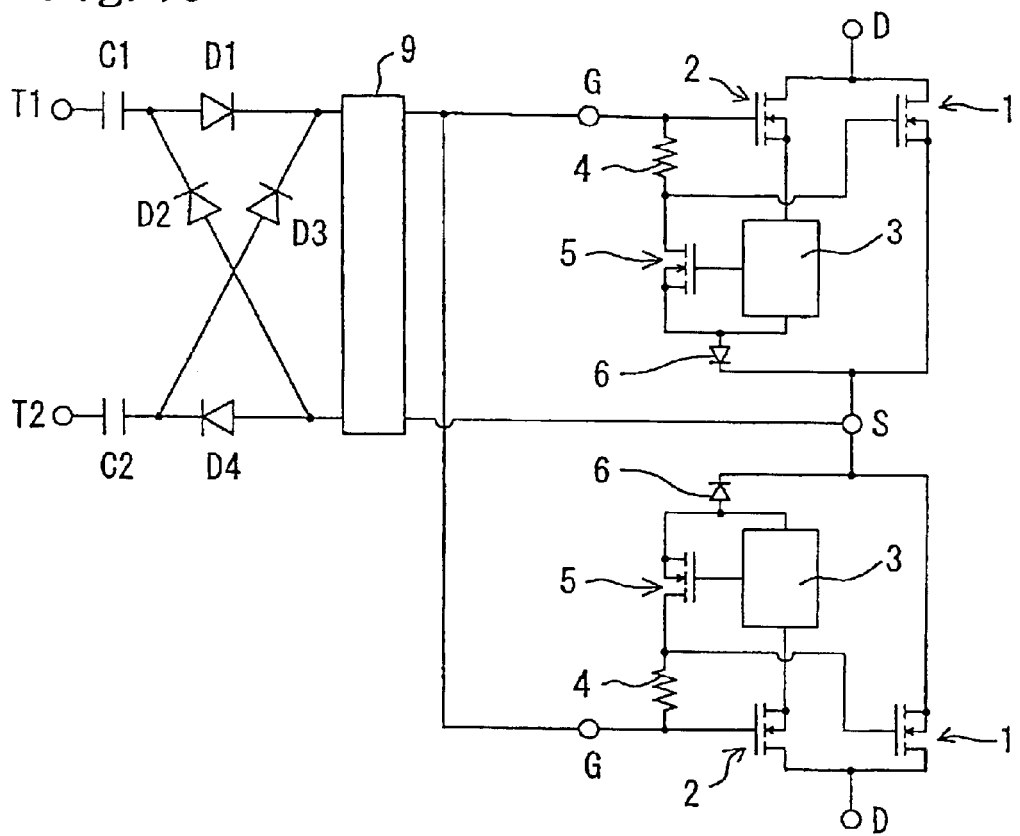
FIG. 10 is a rough circuit diagram of a semiconductor device with protective functions according to Embodiment 6 of the present invention.

As shown in FIG. 10, the semiconductor device with protective functions according to Embodiment 6 is provided with two semiconductor device components with protective functions according to Embodiment 3. Regarding to the two semiconductor device components, their external source electrodes S are commonly connected to each other, while their external gate terminals G are commonly connected to each other. Hereupon, each of the constructive members common with that of Embodiment 3 is given the same reference numeral as that of Embodiment 3, and then the description of the member is omitted.

In addition, the semiconductor device with protective functions according to Embodiment 6 is provided with a rectifying circuit including diodes D1–D4, to which an AC (alternating current) signal applied between an input terminal T1 and another input terminal T2 is inputted through capacitors C1 and C2. The DC (direct current) voltage, which has been rectified by the rectifying circuit is applied between the external gate terminals G and the external source terminals S. Hereupon, one end portion of the capacitor C1 is connected to the input terminal T1 while the other end portion is connected to an input terminal of the rectifying circuit. Meanwhile, one end portion of the capacitor C2 is connected to the input terminal T2 while the other end portion is connected to another input terminal of the rectifying circuit.

Further, a charge-discharge circuit 9 is provided. between the both DC output terminals of the rectifying circuit and both of the external gate terminals G and the external source terminals S. When the DC output voltage of the rectifying circuit reaches a predetermined voltage, the charge-discharge circuit 9 produces high impedance between the both DC output terminals of the rectifying circuit. In consequence, the DC output voltage of the rectifying circuit is applied between the external gate terminal G and the external source terminal S. Meanwhile, when the DC output voltage of the rectifying circuit disappears, the charge-discharge circuit 9 forms a path, through which the electric charge stored by the gate capacity of the main MOSFET 1 is discharged, so as to lower rapidly the voltage between the external gate terminal G and the external source terminal S.

Thus, in the case that the semiconductor device with protective functions according to Embodiment 6 is provided between the power source and the load while the current flowing through from between the both external drain terminals D, D is switched in the two direction, the current does not flow into the protective circuit 3 or protective MOSFET 5 connected to the anode of the non-return diode 6 even if it is designed such that the current can flow from the external source terminals S to the external drain terminals D. In consequence, it may be prevented that the protective circuit 3 or protective MOSFET 5 operates in error. Further, because the electric power is supplied from the power source to each of the protective circuits 3, the semiconductor device can operate with a very small gate driving current utilizing the DC voltage obtained by rectifying the AC signal.

In Embodiments 1–6 described above, the transistors such as the main transistor, the detecting transistor or the like, are composed of MOSFETs. However, those transistors may not limited to MOSFETs so that any transistor of a voltage driven type may be used. For example, instead of the MOSFETs, MOS gate devices such as an IGBT may be used.

Although the present invention is described above taking specific embodiments as examples, it will be understood by those skilled in the art that the present invention is not limited to these embodiments, but covers all modifications which are within the scope and spirit of the present invention as defined by the appended claims.

Industrial Applicability

As described above, a semiconductor device with protective functions according to the present invention is particularly useful for protecting the semiconductor device, which can obtain only a very little gate driving current, against its overheat, and is suitable for being used for a power device or the like.

What is claimed is:

1. A semiconductor device with protective functions having two semiconductor device components inserted between a power source and a load, in each of which an electric current flowing between a first main terminal and a second main terminal is controlled in accordance with a control voltage applied between a control terminal and said second main terminal, said second main terminals of said two semiconductor device components being commonly connected to each other, said control terminals of said two semiconductor device components being commonly connected to each other, and each of said semiconductor device components comprising:

a main transistor of a voltage driven type which is turned to ON or OFF in accordance with said control voltage, said main transistor being inserted between said first main terminal and said second main terminal;

a protective transistor of a voltage driven type inserted between a control electrode of said main transistor and a reference electrode of said main transistor;

a protective circuit which protects said main transistor by said protective transistor when abnormality is detected thereby, said protective circuit betng inserted between said first main terminal and said second main terminal;

a detecting transistor of a voltage driven type which is turned to ON or OFF in accordance with said control voltage, said detecting transistor being inserted between said first main terminal and said protective circuit;

an impedance element inserted between said protective transistor and a junction connecting said control terminal to a control electrode of said detecting transistor; and a non-return diode inserted between said second main terminal and a junction connecting said protective circuit to a reference electrode of said protective transistor, in such a manner that said non-return diode has polarity to prevent a current from flowing from said second main terminal to said protective transistor and said protective circuit.

2. The semiconductor device according to claim 1, further comprising:

a light emitting element which is turned on or turned off in accordance with a signal inputted thereto; and a photovoltaic element which is optically coupled with said light emitting element to generate electromotive force, wherein said electromotive force is applied between said control terminal and said second main terminal.

3. The semiconductor device according to claim 1, wherein a voltage obtained by rectifying an alternating signal is applied between said control terminal and said second main terminal.

4. A semiconductor device with protective functions inserted between a power source and a load, in which an electric current flowing between a first main terminal and a second main terminal is controlled in accordance with a control voltage applied between a control terminal and said second main terminal, comprising:

a main transistor of a voltage driven type which is turned to ON or OFF in accordance with said control voltage, said main transistor being inserted between said first main terminal and said second main terminal;

a protective transistor of a voltage driven type inserted between a control electrode of said main transistor and a reference electrode of said main transistor;

a protective circuit which protects said main transistor by said protective transistor when abnormality is detected thereby, said protective circuit being inserted between said first main terminal and said second main terminal;

a detecting transistor of a voltage driven type which is turned to ON or OFF in accordance with said control voltage, said detecting transistor being inserted between said first main terminal and said protective circuit; and an impedance element inserted between said protective transistor and a junction connecting said control terminal to a control electrode of said detecting transistor, wherein power is supplied from said power source to said protective circuit through said first main terminal and said detecting transistor, wherein for each of said main transistor, said detecting transistor and said protective transistor, conductivity between a one side electrode and a further side electrode acting as a reference electrode is actuated by a potential difference between said further side electrode and a control electrode, said protective circuit comprising:

a thermosensible element with a negative temperature characteristic, which is composed of semiconductor, said thermosensible element being thermally connected with said main transistor; and a protective circuit transistor of a voltage driven type, its one side electrode being connected to the control electrode of said protective transistor, its further side electrode being connected to one end portion of said thermosensible element and the further side electrode of said protective transistor, and its control electrode being connected to the other end portion of said thermosensible element, wherein said protective circuit transistor is inserted between said first main terminal and said second main terminal so as to be provided with a power through said detecting transistor, the control electrode of said protective circuit transistor being connected in such a manner that conductivity between its both side electrodes is shut in accordance with a potential rise between said first main terminal and said second main terminal.

5. The semiconductor device according to claim 4, further comprising a non-return diode inserted between said second main terminal and the further electrode of each of said protective transistor and said protective circuit transistor, in such a manner that said non-return diode has polarity to prevent a current trom flowing from said second main terminal to said protective transistor and said protective circuit.

6. The semiconductor device according to claim 4, wherein each of said main transistor, said detecting transistor and said protective transistor is composed of a MOSFET having a drain electrode as said one side electrode, a source electrode as said further side electrode and a gate electrode as said control electrode.

7. A semiconductor device with protective functions inserted between a power source and a load, in which an electric current flowing between a first main terminal and a second main terminal is controlled in accordance with a control voltage applied between a control terminal and said second main terminal, comprising:

a main transistor of a voltage driven type which is turned to ON or OFF in accordance with said control voltage, said main transistor being inserted between said first main terminal and said second main terminal;

a protective transistor of a voltage driven type inserted between a control electrode of said main transistor and a reference electrode of said main transistor;

a protective circuit which protects said main transistor by said protective transistor when abnormality is detected thereby, said protective circuit being inserted between said first main terminal and said second main terminal;

a detecting transistor of a voltage driven type which is turned to ON or OFF in accordance with said control voltage, said detecting transistor being inserted between said first main terminal and said protective circuit; and an impedance element inserted between said protective transistor and a junction connecting said control terminal to a control electrode of said detecting transistor, wherein power is supplied from said power source to said protective circuit through said first main terminal and said detecting transistor, wherein said detecting transistor is composed of two or more detecting transistor components, while for each of said main transistor, said detecting transistor components and said protective transistor, conductivity between a one side electrode and a further side electrode acting as a reference electrode is actuated by a potential difference between said further side electrode and a control electrode, said protective circuit comprising:

a thermosensible element with a negative temperature characteristic, which is composed of semiconductor, said thermosensible element being thermally connected with said main transistor; and a protective circuit transistor of a voltage driven type, its one side electrode being connected to the control electrode of said protective transistor, its further side electrode being connected to one end portion of said thermosensible element and the further side electrode of said protective transistor, and its control electrode being connected to the other end portion of said thermosensible element, wherein said protective circuit transistor is inserted between said first main terminal and said second main terminal so as to be provided with a power through any one of said detecting transistor components, the control electrode of said protective circuit transistor being connected in such a manner that conductivity between its both side electrodes is shut in accordance with a potential rise between said first main terminal and said second main terminal.

8. The semiconductor device according to claim 7, further comprising a non-return diode inserted between said second main terminal and the further electrode of each of said protective transistor and said protective circuit transistor, in such a manner that said non-return diode has polarity to prevent a current from flowing from said second main terminal to said protective transistor and said protective circuit.

9. The semiconductor device according to claim 7, wherein each of said main transistor, said detecting transistor components and said protective transistor is composed of a MOSFET having a drain electrode as said one side electrode, a source electrode as said further side electrode and a gate electrode as said control electrode.

10. A semiconductor device with protective functions inserted between a power source and a load, in which an electric current flowing between a first main terminal and a second main terminal is controlled in accordance with a control voltage applied between a control terminal and said second main terminal, comprising:

a main transistor of a voltage driven type which is turned to ON or OFF in accordance with said control voltage, said main transistor being inserted between said first main terminal and said second main terminal;

a protective transistor of a voltage driven type inserted between a control electrode of said main transistor and a reference electrode of said main transistor;

a protective circuit which protects said main transistor by said protective transistor when abnormality is detected thereby, said protective circuit being inserted between said first main terminal and said second main terminal;

a detecting transistor of a voltage driven type which is turned to ON or OFF in accordance with said control voltage, said detecting transistor being inserted between said first main terminal and said protective circuit; and an impedance element inserted between said protective transistor and a junction connecting said control terminal to a control electrode of said detecting transistor, wherein power is supplied from said power source to said protective circuit through said first main terminal and said detecting transistor, wherein each of said main transistor, said detecting transistor and said protective transistor is composed of a MOSFET, while said protective circuit comprises:

second, third and fourth impedance elements, each of which is commonly connected to a source electrode of said detecting transistor at one end portion thereof;

first, second and third MOSFETs, each of which is commonly connected to said second main terminal at a source electrode thereof; and a diode array which is thermally connected with said main transistor and inserted between a drain electrode of said second MOSFET and the source electrode of said second MOSFET in such a manner that an anode side of said diode array is connected to the drain electrode of said second MOSFET, wherein a further end portion of said second impedance element is connected to a drain electrode of said first MOSFET, a further end portion of said third impedance element being connected to the drain electrode of said second MOSFET, a further end portion of said fourth impedance element being connected to a drain electrode of said third MOSFET, a gate electrode of said first MOSFET being connected to the drain electrode of said second MOSFET, a gate electrode of said second MOSFET being connected to the drain electrode of said third MOSFET, a gate electrode of said third MOSFET being connected to the drain electrode of said first MOSFET, a gate electrode of said protective transistor being connected to the drain electrode of said first MOSFET, a source electrode of said protective transistor being connected to a source electrode of said main transistor, and a drain electrode of said protective transistor being connected to a gate electrode of said main transistor.

11. A semiconductor device with protective functions inserted between a power source and a load, in which an electric current flowing between a first main terminal and a second main terminal is controlled in accordance with a control voltage applied between a control terminal and said second main terminal, comprising:

a main transistor of a voltage driven type which is turned to ON or OFF in accordance with said control voltage, said main transistor being inserted between said first main terminal and said second main terminal;

a protective transistor of a voltage driven type inserted between a control electrode of said main transistor and a reference electrode of said main transistor;

a protective circuit which protects said main transistor by said protective transistor when abnormality is detected thereby, said protective circuit being inserted between said first main terminal and said second main terminal;

a detecting transistor of a voltage driven type which is turned to ON or OFF in accordance with said control voltage, said detecting transistor being inserted between said first main terminal and said protective circuit;

an impedance element inserted between said protective transistor and a junction connecting said control terminal to a control electrode of said detecting transistor, wherein power is supplied from said power source to said protective circuit through said first main terminal and said detecting transistor; and a non-return diode inserted between said second main terminal and a junction connecting said protective circuit to a reference electrode of said protective transistor, in such a manner that said non-return diode has polarity to prevent a current from flowing from said second main terminal to said protective transistor and said protective circuit, wherein each of said main transistor, said detecting transistor and said protective transistor is composed of a MOSFET, while said protective circuit comprises:

second, third and fourth impedance elements, each of which is commonly connected to a source electrode of said detecting transistor at one end portion thereof;

first, second and third MOSFETs, each of which is commonly connected to an anode of said non-return diode at a source electrode thereof, and a diode array which is thermally connected with said main transistor and inserted between a drain electrode of said second MOSFET and a source electrode of said main transistor in such a manner that an anode side of said diode array is connected to the drain electrode of said second MOSFET, wherein a further end portion of said second impedance element is connected to a drain electrode of said first MOSFET, a further end portion of said third impedance element being connected to the drain electrode of said second MOSFET, a further end portion of said fourth impedance element being connected to a drain electrode of said third MOSFET, a gate electrode of said first MOSFET being connected to the drain electrode of said second MOSFET, a gate electrode of said second MOSFET being connected to the drain electrode of said third MOSFET, a gate electrode of said third MOSFET being connected to the drain electrode of said first MOSFET, a gate electrode of said protective transistor being connected to the drain electrode of said first MOSFET, a source electrode of said protective transistor being connected to the source electrode of said main transistor through said non-return diode, and a drain electrode of said protective transistor being connected to a gate electrode of said main transistor.

12. A semiconductor device with protective functions inserted between a power source and a load, in which an electric current flowing between a first main terminal and a second main terminal is controlled in accordance with a control voltage applied between a control terminal and said second main terminal, comprising:

a main transistor of a voltage driven type which is turned to ON or OFF in accordance with said control voltage, said main transistor being inserted between said first main terminal and said second main terminal;

a protective transistor of a voltage driven type inserted between a control electrode of said main transistor and a reference electrode of said main transistor;

a protective circuit which protects said main transistor by said protective transistor when abnormality is detected thereby, said protective circuit being inserted between said first main terminal and said second main terminal;

a detecting transistor of a voltage driven type which is turned to ON or OFF in accordance with said control voltage, said detecting transistor being inserted between said first main terminal and said protective circuit; and an impedance element inserted between said protective transistor and a junction connecting said control terminal to a control electrode of said detecting transistor, wherein power is supplied from said power source to said protective circuit through said first main terminal and said detecting transistor, wherein said detecting transistor is composed of a first detection transistor and a second detection transistor, each of said main transistor, said first detection transistor, said second detection transistor and said protective transistor being composed of a MOSFET, said impedance element being defined as a first impedance element, said protective circuit comprising:

second and third impedance elements, each of which is commonly connected to a source electrode of said first detection transistor at one end portion thereof;

first and second MOSFETs, each of which is commonly connected to a source electrode of said main transistor at a source electrode thereof;

a diode array which is thermally connected with said main transistor and inserted between a drain electrode of said second MOSFET and the source electrode of said second MOSFET in such a manner that an anode side of said diode array is connected to the drain electrode of said second MOSFET; and a fourth impedance element which is connected to a source electrode of said second detection transistor at one end portion thereof and to the source electrode of said main transistor at a further end portion thereof, wherein a further end portion of said second impedance element is connected to a drain electrode of said first MOSFET, a further end portion of said third impedance element being connected to the drain electrode of said second MOSFET, a gate electrode of said first MOSFET being connected to the drain electrode of said second MOSFET, a gate electrode of said second MOSFET being connected to the source electrode of said second detection transistor, a gate electrode of said protective transistor being connected to the drain electrode of said first MOSFET, a source electrode of said protective transistor being connected to the source electrode of said main transistor, a drain electrode of said protective transistor being connected to a gate electrode of said main transistor, a gate electrode of said first detection transistor being connected to the gate electrode of said main transistor through said first impedance element, and a gate electrode of said second detection transistor being connected to the gate electrode of said main transistor.

13. A semiconductor device with protective functions inserted between a power source and a load, in which an electric current flowing between a first main terminal and a second main terminal is controlled in accordance with a control voltage applied between a control terminal and said second main terminal, comprising:

a main transistor of a voltage driven type which is turned to ON or OFF in accordance with said control voltage, said main transistor being inserted between said first main terminal and said second main terminal;

a protective transistor of a voltage driven type inserted between a control electrode of said main transistor and a reference electrode of said main transistor;

a protective circuit which protects said main transistor by said protective transistor when abnormality is detected thereby, said protective circuit being inserted between said first main terminal and said second main terminal;

a detecting transistor of a voltage driven type which is turned to ON or OFF in accordance with said control voltage, said detecting transistor being inserted between said first main terminal and said protective circuit;

an impedance element inserted between said protective transistor and a junction connecting said control terminal to a control electrode of said detecting transistor, wherein power is supplied from said power source to said protective circuit through said first main terminal and said detecting transistor; and a non-return diode inserted between said second main terminal and a junction connecting said protective circuit to a reference electrode of said protective transistor, in such a manner that said non-return diode has polarity to prevent a current from flowing from said second main terminal to said protective transistor and said protective circuit, wherein said detecting transistor is composed of a first detection transistor and a second detection transistor, each of said main transistor, said first detection transistor, said second detection transistor and said protective transistor being composed of a MOSFET, said impedance element being defined as a first impedance element, said protective circuit comprising:

second and third impedance elements, each of which is commonly connected to a source electrode of said first detection transistor at one end portion thereof;

first and second MOSFETs, each of which is commonly connected to an anode of said non-return diode at a source electrode thereof;

a diode array which is thermally connected with said main transistor and inserted between a drain electrode of said second MOSFET and a source electrode of said main transistor in such a manner that an anode side of said diode array is connected to the drain electrode of said second MOSFET; and a fourth impedance element which is connected to a source electrode of said second detection transistor at one end portion thereof and to the source electrode of said main transistor at a further end portion thereof, wherein a further end portion of said second impedance element is connected to a drain electrode of said first MOSFET, a further end portion of said third impedance element being connected to the drain electrode of said second MOSFET, a gate electrode of said first MOSFET being connected to the drain electrode of said second MOSFET, a gate electrode of said second MOSFET being connected to the source electrode of said second detection transistor, a gate electrode of said protective transistor being connected to the drain electrode of said first MOSFET, a source electrode of said protective transistor being connected to the source electrode of said main transistor through said non-return diode, a drain electrode of said protective transistor being connected to a gate electrode of said main transistor, a gate electrode of said first detection transistor being connected to the gate electrode of said main transistor through said first impedance element, and a gate electrode of said second detection transistor being connected to the gate electrode of said main transistor.

14. The semiconductor device according to claim 5, wherein each of said main transistor, said detecting transistor and said protective transistor is composed of a MOSFET having a drain electrode as said one side electrode, a source electrode as said further side electrode and a gate electrode as said control electrode.

15. The semiconductor device according to claim 8, wherein each of said main transistor, said detecting transistor components and said protective transistor is composed of a MOSFET having a drain electrode as said one side electrode, a source electrode as said further side electrode and a gate electrode as said control electrode.

* * * * *

UNITED STATES PATENT AND TRADEMARK OFFICE
CERTIFICATE OF CORRECTION

| | |
|---|---|
| PATENT NO. | : 6,930,870 B2 |
| APPLICATION NO. | : 10/380171 |
| DATED | : August 16, 2005 |
| INVENTOR(S) | : T. Nobe et al. |

Page 1 of 1

It is certified that error appears in the above-identified patent and that said Letters Patent is hereby corrected as shown below:

At column 20, line 31 (claim 1, line 22) of the printed patent, "betng" should be ---being---.

At column 23, line 52 (claim 10, line 47) of the printed patent, "dram" should be ---drain---.

Signed and Sealed this

Eighth Day of August, 2006

JON W. DUDAS
*Director of the United States Patent and Trademark Office*